United States Patent
MacPherson

[19]

[11] Patent Number: 6,087,200
[45] Date of Patent: Jul. 11, 2000

[54] USING MICROSPHERES AS A STRESS BUFFER FOR INTEGRATED CIRCUIT PROTOTYPES

[75] Inventor: John MacPherson, Fremont, Calif.

[73] Assignee: Clear Logic, Inc., Santa Clara, Calif.

[21] Appl. No.: 09/133,205

[22] Filed: Aug. 13, 1998

[51] Int. Cl.[7] .......................... H01L 21/44; H01L 21/48; H01L 21/50; H01L 23/22; H01L 23/24

[52] U.S. Cl. .......................... 438/106; 438/118; 438/124; 438/127; 257/687; 257/701

[58] Field of Search ..................... 438/106–127; 264/109–128

[56] References Cited

U.S. PATENT DOCUMENTS

| | | | |
|---|---|---|---|
| 3,608,029 | 9/1971 | Hough | 264/112 |
| 3,670,091 | 6/1972 | Frantz et al. | 174/52 PE |
| 4,001,655 | 1/1977 | Voyles et al. | 317/230 |
| 4,118,861 | 10/1978 | Palmisano | 29/631 |
| 4,163,072 | 7/1979 | Soos | 427/96 |
| 4,529,755 | 7/1985 | Nishikawa et al. | 523/436 |
| 4,558,510 | 12/1985 | Tani et al. | 29/588 |
| 4,933,744 | 6/1990 | Segawa et al. | 357/72 |
| 5,026,667 | 6/1991 | Roberts, Jr. | 437/209 |
| 5,097,317 | 3/1992 | Fujimoto et al. | 357/72 |
| 5,300,459 | 4/1994 | Ushikubo et al. | 437/211 |
| 5,627,107 | 5/1997 | Howard | 264/272.17 |
| 5,706,175 | 1/1998 | Takei | 361/760 |
| 5,717,232 | 2/1998 | Inoue | 257/283 |

FOREIGN PATENT DOCUMENTS

| | | |
|---|---|---|
| 63-79353 | 4/1988 | Japan . |
| 10-173006 | 6/1998 | Japan . |

*Primary Examiner*—Charles Bowers
*Assistant Examiner*—Erik J Kielin
*Attorney, Agent, or Firm*—Skjerven, Morrill, MacPherson, Franklin & Friel LLP; Tom Chen

[57] ABSTRACT

A process for packaging a die uses compressible microspheres to form a stress buffer layer between the die and an epoxy encapsulant to absorb stresses on the die caused by the different thermal expansion rates of the epoxy and die during temperature changes. By using a compressible layer of microspheres or other material, the need for a nitride passivation or other insulating layer to protect the die from thermally-induced stress is eliminated. In addition, the number and size of the microspheres and the amount of epoxy used to seal the package can be adjusted so that the epoxy is approximately co-planar with the top of the package to allow the package to be handled and used with standard equipment and processes.

9 Claims, 2 Drawing Sheets

USING MICROSPHERES AS A STRESS BUFFER FOR INTEGRATED CIRCUIT PROTOTYPES

FIELD OF THE INVENTION

The present invention relates generally to the manufacture of semiconductor devices and, more particularly, to a process of assembling an integrated circuit into a package.

DESCRIPTION OF RELATED ART

Due to the ever-increasing number of applications and uses for integrated circuits, two primary objectives for IC manufacturers are the ability to customize circuits for specific uses and the ability to quickly turn around a circuit prototype to the customer. One method of customizing or configuring circuits is to utilize laser fuses to alter the structure, path or electrical characteristics of the semiconductor device. Laser fuses, which also refer to antifuses, can also be used to repair memory elements. In particular, fuses have been used to: (1) repair nonfunctional devices through the selective deletion of defective portions of the circuitry or the substitution of functional redundant circuitry for the defective portions of the circuitry; (2) mark the device for identification of characteristics in a manner that is readable visually or electrically, e.g., serialization of the integrated circuit or how the device has been configured by the laser; and (3) customize an integrated circuit such that the integrated circuit has specific circuit or electrical characteristics.

In order to quickly deliver prototypes of such customized or configured integrated circuits, hereinafter referred to as die, a laser or other energy beam is typically utilized to perform the configuration near the completion of the wafer fabrication. First, the die are prepared by fabricating the wafers nearly to completion and then storing them in preparation for configuration. For plastic packages such as Plastic Leaded Chip Carrier (PLCC), Plastic Quad Flat Pack (PQFP), and Plastic Thin Quad Flat Pack (TQFP), prototype packages are prepared in advance by building packages without any die or bond wires and then etching or otherwise removing portions of the package material over the lead frame to form a cavity, thereby exposing the die pad and lead frame fingers. The resultant package is then ready for die configuration and assembly. A typical configuration and assembly process includes the following basic steps:

1. configure the die on a wafer using a laser, such as by ablation of the fuses;
2. deposit a layer of silicon nitride or other passivation material;
3. pattern and etch the nitride to expose bonding pads;
4. test the die on the wafer to determine which die are functional;
5. saw the wafer into individual die and extract a working die;
6. deposit a small amount of die attach epoxy on the die pad of the package;
7. place the working die on the die attach epoxy and compress the die and the package together to distribute the epoxy;
8. bake the package and die to cure the epoxy to bond the die to the package;
9. attach bond wires between the bonding pads on the die and lead fingers on the package;
10. fill the cavity with epoxy to seal the package; and
11. bake the package to cure the epoxy.

The laser configuration step is preferably performed prior to the nitride deposition step because of the difficulty in successfully configuring fuses through a relatively thick layer of nitride. If the nitride layer is applied first, the nitride can be removed over the fuses prior to laser configuration, but this makes the die more difficult to configure and increases both the cost and number of process steps.

Once the die is configured and secured in the package, the package is sealed by filling the cavity containing the die with an epoxy. Filling the cavity with an epoxy to seal the package is preferential to applying a lid and covering the cavity for at least two reasons. One, the additional thickness of the lid may prevent the packaged die from fitting in some types of manufacturing equipment, such as certain test sockets and lead conditioning handlers. Two, in some cases, die are placed in the package with the cavity on the same side of the package as the test leads. As a result, the additional height from the lid could prevent the test leads from making contact with the circuit board at the time the packaged die is to be soldered to the circuit board. Thus, by using a lid instead of epoxy, certain types of applications for the packaged die are precluded due to the increased dimensions of the packaged die from the additional height of the lid.

In order to try and reduce the effects of the additional height of the lid, a recess could be formed into the package such that when the lid is placed on the package, the lid is flush with the plane of the package. However, in many cases, especially with TQFP package designs, such a recess cannot be built into the package because the lid would then contact and damage the bond wires. Thus, as discussed above, two preferred ways for performing this type of prototype configuration and packaging process are to configure the die prior to subsequent film or material depositions and to seal the package by filling the cavity rather than covering the package with a lid.

A prototype built according to the flow process described above would typically take a total of seven to nine days lead time to deliver a prototype, with three to four days for passivation processing, three days for assembly, and one to two days for all other processing combined (laser configuration, test, shipping, and handling). To further reduce the time for prototype delivery, an unconfigured die can first be packaged by securing the die to the die pad and attaching the bond wires. Thus, the packaged die is stored until it is ready for configuration. A typical configuration and assembly process for such a method includes the following basic steps:

1. configure the die in a package using a laser;
2. test the die in the package to determine if the die is functional;
3. fill the package cavity with epoxy to seal the package; and
4. bake the package to cure the epoxy.

In both of the above-described processes, filling the package with epoxy helps protect the enclosed semiconductor device from exposure to environmental hazards such as air, moisture, chemicals, dust, and light, as well as increase the durability of the device. However, due to the different thermal expansion coefficients of the epoxy which is used as the encapsulant and the materials which constitute the semiconductor device, the die is subjected to a thermal stress when the die and package are heated, such as during operation of the device or when the epoxy is cured and baked. Also, during the subsequent cool-down to room temperature, the epoxy shrinks more than the die and lead frame, which can damage the active circuitry on the die, as shown in FIG. 1.

In FIG. 1, active circuitry 10 formed over a silicon substrate 15 is covered with a spacer oxide 11 and an epoxy 13. As the epoxy is baked and cured, the difference in the thermal expansion coefficients of the epoxy 13 and of the active circuitry 10 and substrate 15 causes stress on the active circuitry 10. The compressive stress of epoxy 13 (represented by arrows 14) can be enough to damage or break active circuitry 20. As shown in FIG. 2, an insulating layer 12, such as silicon nitride, can be formed between the active circuitry 10 and the epoxy 13 to relieve much of the compressive stress that would otherwise be placed on the active elements as a result of temperature changes.

Therefore, while the processing sequence using the nitride deposition step helps protect active circuitry from damage due to the stress of curing the epoxy, such a process also increases the difficulty of reliably configuring the fuses, resulting in lower yield as compared to processing sequences without nitride deposition. As a result, an undesirable trade-off exists between either increasing prototype delivery time at the cost of possible circuitry damage during curing or protecting active circuitry at the cost of lower yield.

Accordingly, a process that seals the die in the package and provides thermal compensation, while not affecting the form or fit of the package is desired.

SUMMARY

In accordance with the present invention, a compressible layer is deposited between the upper surface of a die and an epoxy encapsulant to act as a stress buffer for absorbing stresses caused by differing thermal expansion rates of the epoxy and die which are induced by temperature changes.

In one embodiment, a die is placed into the cavity of a die package and secured to a lead frame within the die package. Bond wires are then attached from bond pads on the die to lead fingers within the cavity. The die is configured to a specific use or application. Compressible microspheres of varying sizes or approximately the same size are deposited into the cavity and over the die to form a compressible layer over the active circuit on the die. The remainder of the cavity is then filled with an epoxy to seal the cavity and encapsulate the die within the package. Preferably, the upper surfaces of the epoxy and the die package are approximately co-planar so that the size of the resultant die package is not increased, which allows the package to be handled and used with standard equipment and processes. The viscosity of the epoxy is typically high enough to prevent the epoxy from flowing down between the microspheres and onto the die before the epoxy sets. The epoxy can then be cured, with any stress caused by the curing absorbed by the compressible microspheres. As a result, the active circuitry on top of the die is protected against thermal induced stress caused by temperature changes from differences in the thermal expansion coefficients of the die and epoxy.

In another embodiment of the present invention, a flexible filler material, such as the previously described microspheres, is added to the epoxy to decrease the thermal expansion coefficient of the epoxy. Consequently, the thermal coefficients of the epoxy and die are more closely matched, which reduces the temperature-induced stress on the die.

The present invention will be better understood in light of the following detailed description, taken together with the accompanying drawings.

BRIEF DESCRIPTION OF THE DRAWINGS

Use of the same reference numbers in different figures indicates similar or like elements.

DETAILED DESCRIPTION

In accordance with an embodiment of the present invention, a process for packaging a die deposits a compressible layer between the die and a sealing epoxy to form a stress barrier between the top of the die and the epoxy, thereby eliminating the need for a nitride layer.

Figure 1:
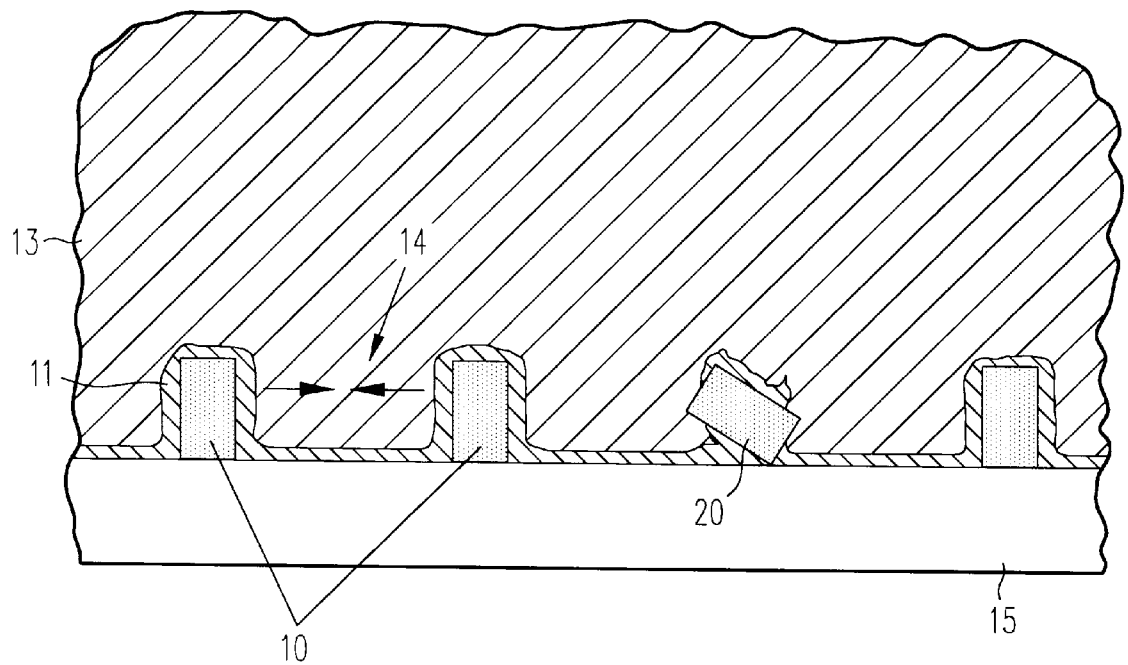
FIG. 1 is a cross-sectional view of a portion of a packaged die without a nitride passivation layer.
Figure 2:
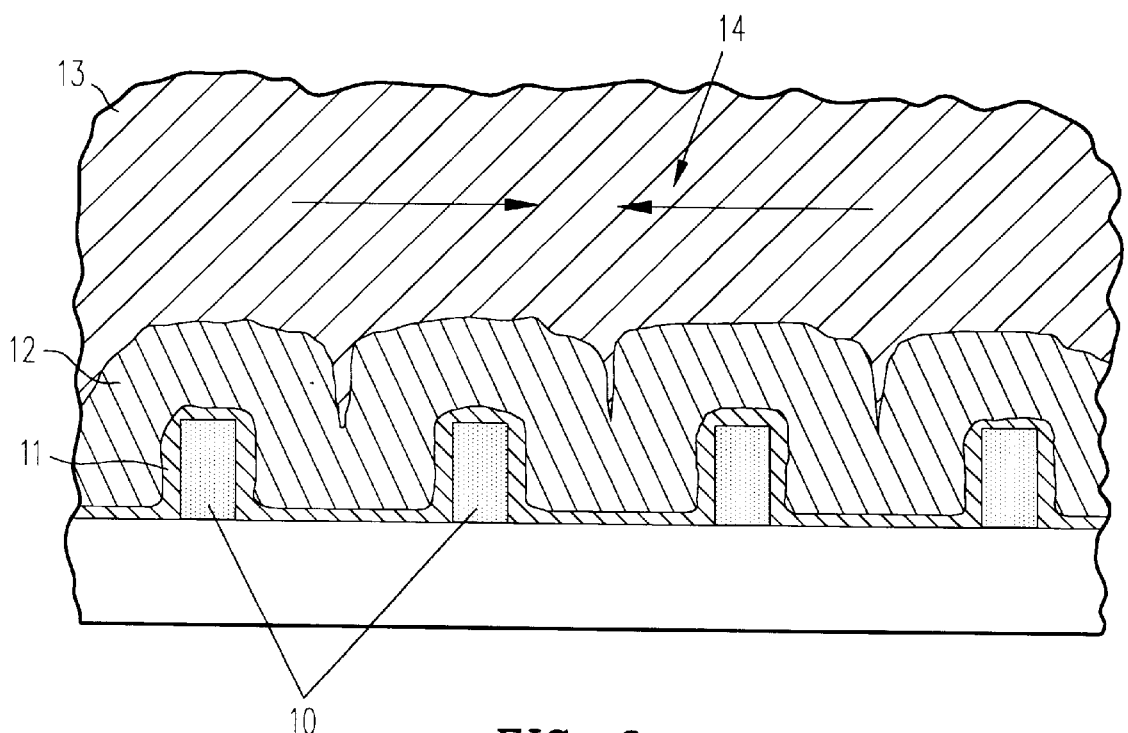
FIG. 2 is a cross-sectional view of the packaged die of FIG. 1 with a nitride passivation layer.
Figure 3:
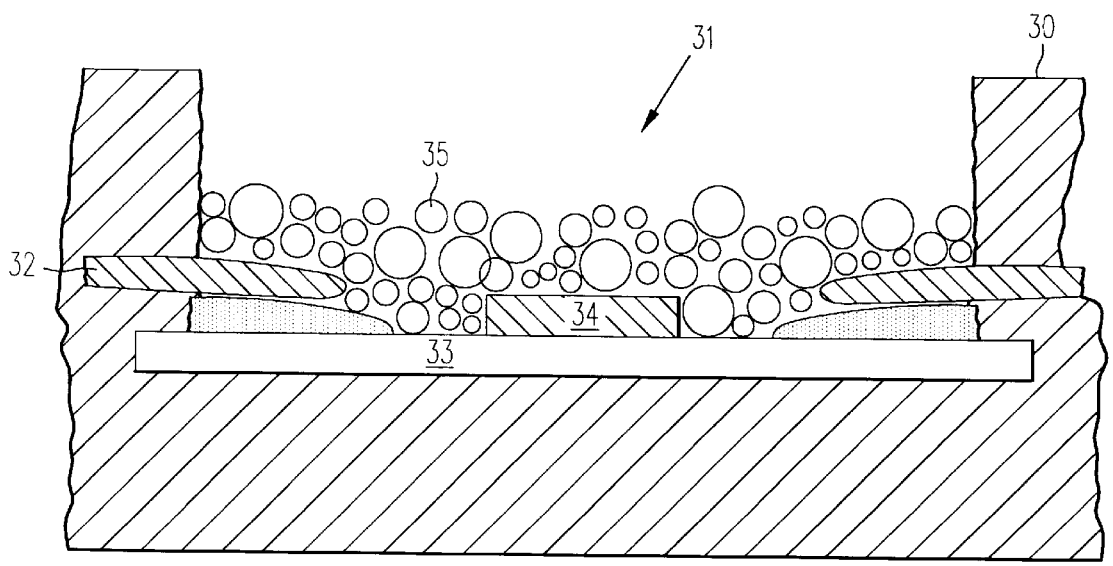
FIGS. 3 and 4 are cross-sectional views of a process for packaging a die according to one embodiment of the present invention.

In one embodiment of the present invention, shown in FIG. 3, a plastic or other type of package 30 is provided, which includes a cavity 31, lead fingers 32, and a lead frame 33. A die 34 is secured to lead frame 33 by a die attach epoxy or other suitable adhesive. Die 34 can be unconfigured or partially configured prior to being secured to lead frame 33. Bond wires (not shown for clarity) are then attached from bond pads on die 34 to lead fingers 32. The resultant die and package can be stored until ready for configuration, which can then be performed with a laser or other conventional tool or method.

Compressible microspheres 35, ranging in diameter from 20 to 200 microns, which are commonly available from companies such as Tap Plastics of Dublin, California, are deposited in cavity 31. Microspheres 35 are preferentially hollow and varying in size but may be of a solid material as long as the material is highly compressible. Microspheres 35 are also preferably made of silica but can be made of other organic or inorganic materials such as naturals polymer, or silicone-based rubber, zirconium oxide quartz, fiberglass, alumina, aluminum hydroxide, calcium carbonate, glass, graphite, carbon, or other suitable materials. Microspheres 35 can also be approximately the same size, with the size dependent upon the size and spacing of the die features, for example. Typically, the thickness of the layer of microspheres 35 will be at least 20 microns.

Figure 4:
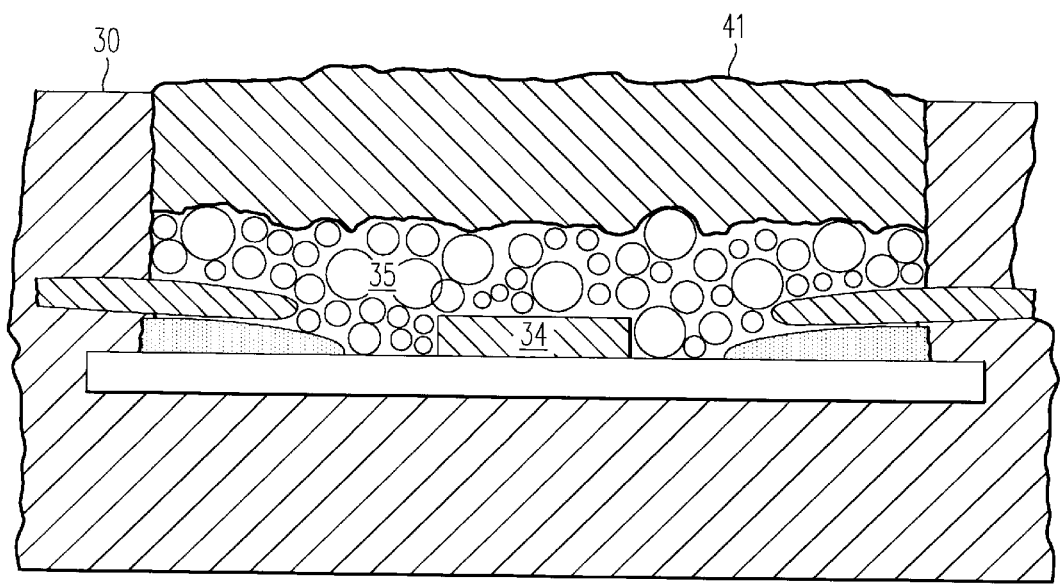

Once microspheres 35 have been deposited over die 34, an epoxy 41 is used to fill the remainder of cavity 31 to seal the cavity and encapsulate die 34, as shown in FIG. 4. Preferably, the upper surface of the epoxy 41 and the upper surface of the die package 30 are approximately co-planar. The viscosity of epoxy 41 is typically high enough to prevent the epoxy from flowing down between microspheres 35 before the epoxy sets and hardens. Thus, once hardened, the epoxy 41 forms a rigid barrier to enclose the microspheres 35 over the die 34.

The microspheres 35 form a stress barrier between the top of the die and the epoxy. During curing of the epoxy, the microspheres 35 absorb stress on the die caused by epoxy shrinkage. Furthermore, the active circuitry on die 34 is protected from temperature effects due to different thermal expansion rates between the die and epoxy, which would cause the epoxy 41 to exert pressure on the die during elevated temperature cycling. Thus, the compressibility of microspheres 35 is such that stress induced by the epoxy is completely or partially absorbed by the microspheres, which results in protection of the active circuitry on the die 34 without the need for a nitride passivation layer or other type of insulation layer. Because only portions of the microspheres contact portions of the die, the stress applied to the active circuitry on the die is reduced as compared to previous methods in which a solid flexible layer contacts a majority or all of the upper surface of the die. Furthermore, epoxy types with a wider range of thermal expansion coefficients can be used to seal the die package as the compressibility of the microspheres increase.

Because, preferably, the level of epoxy 41 is approximately the same height as the top of package 30, the size of the package is not undesirably increased, such is the case with using lids. As a result, die packages according to the present invention, e.g., as shown in FIG. 4, permit the package to be handled or installed using the same techniques as for standard plastic packages.

In another embodiment of the present invention, a filler material, such as the above-described microspheres, is added to the epoxy 41. The filler material may be any material which is flexible or compressible, electrically insulating, and chemically inert to the epoxy. Suitable filler materials include copolymers, natural and synthetic rubber, oxides, quartz, glass, sand, graphite, carbon, silica, clay, alumina, asbestos, gypsum, magnesite, mica, talc, calcined kaolin, nylon, and the like. Such fillers are used to minimize the difference between the thermal expansion coefficients of the epoxy 41 and the die 34 by decreasing the thermal expansion coefficient of the epoxy 41. By more closely matching the thermal expansion coefficients, the amount of stress applied to the microspheres is reduced. Consequently, less stress is applied to the active circuitry on the die, which lessens the effect from the compressive forces caused by the curing of the epoxy and other stresses such as the expansion and contraction of the epoxy during temperature cycling. In addition, with less stress needed to be absorbed, the compressibility of the microspheres can be reduced.

Thus, by using microspheres or a similarly suitable layer as a stress buffer between the die and the epoxy encapsulant, a die can be sealed into a package without the need of a nitride passivation layer, which permits a simpler and more reliable fuse disconnection process. Furthermore, the resulting die package is not restricted from further automated handling or from applications which require strict conformance to the form and fit of the original package design.

While particular embodiments of the present invention have been shown and described, it will be obvious to those skilled in the art that changes and modifications may be made without departing from this invention in its broader aspects. For example, the objects deposited between the die and the epoxy and into the epoxy in other embodiments are described as spheres. However, other shaped flexible objects, such as ovals, can also be used. Therefore, the appended claims are to encompass within their scope all such changes and modifications as fall within the true spirit and scope of this invention.

I claim:

1. A process for packaging a die in a die package, the die package having a cavity containing a lead frame and a top surface, the process comprising:

securing the die on the lead frame within the cavity of the die package;

depositing compressible objects into the cavity; and filling the remainder of the cavity with an epoxy to seal the die package, wherein at least a layer of the compressible objects remains unbound between the die and the epoxy.

2. The process of claim 1, wherein the the compressible objects are of different sizes.

3. The process of claim 1, wherein the compressible objects are approximately the same size.

4. The process of claim 1, wherein the compressible objects are spherical.

5. The process of claim 4, wherein the diameters of the compressible objects range from 20 to 200 microns.

6. The process of claim 1, wherein the epoxy has a top surface that is approximately co-planar with the top surface of the die package.

7. The process of claim 1, wherein the epoxy contains a flexible filler material.

8. The process of claim 7, wherein the flexible filler material comprises compressible microspheres.

9. The process of claim 7, wherein the flexible filler material reduces the thermal expansion coefficient of the epoxy containing the flexible filler material.

* * * * *